United States Patent
Tsuda

(10) Patent No.: US 8,147,786 B2
(45) Date of Patent: Apr. 3, 2012

(54) GAS EXHAUST SYSTEM OF FILM-FORMING APPARATUS, FILM-FORMING APPARATUS, AND METHOD FOR PROCESSING EXHAUST GAS

(75) Inventor: Einosuke Tsuda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/277,040

(22) Filed: Oct. 19, 2011

(65) Prior Publication Data

US 2012/0031334 A1 Feb. 9, 2012

Related U.S. Application Data

(63) Continuation of application No. 12/295,675, filed as application No. PCT/JP2007/057398 on Apr. 2, 2007.

(30) Foreign Application Priority Data

Apr. 4, 2006 (JP) ................. 2006-102920
Mar. 15, 2007 (JP) ................. 2007-066650

(51) Int. Cl.
*C23C 16/00* (2006.01)
*B01D 53/68* (2006.01)

(52) U.S. Cl. ............ 423/240 R; 423/210; 62/55.5; 118/715; 427/250; 427/255.28; 427/255.39; 427/255.391

(58) Field of Classification Search ........... 423/240 R, 423/210; 62/55.5; 118/715; 427/250, 255.28, 427/255.39, 255.391
See application file for complete search history.

(56) References Cited

U.S. PATENT DOCUMENTS

| | | | |
|---|---|---|---|
| 5,618,349 | A | 4/1997 | Yuuki |
| 6,773,687 | B1 | 8/2004 | Hasegawa |
| 7,455,720 | B2 * | 11/2008 | Gu ................. 95/288 |
| 2006/0180026 | A1 * | 8/2006 | Gu ................. 95/288 |
| 2006/0196421 | A1 | 9/2006 | Ronsse et al. |
| 2008/0051478 | A1 | 2/2008 | Tran et al. |

(Continued)

FOREIGN PATENT DOCUMENTS

JP 60183004 A 9/1985

(Continued)

OTHER PUBLICATIONS

Korean Office Action issued on Jan. 7, 2011 in corresponding Korean Application No. 10-2008-7023959 (with an English translation).

*Primary Examiner* — Jeffrie R Lund
(74) *Attorney, Agent, or Firm* — Oblon, Spivak, McClelland, Maier & Neustadt, L.L.P.

(57) ABSTRACT

A film-forming apparatus includes a processing chamber, and $TiCl_4$ gas and $NH_3$ gas are supplied into the processing chamber for forming a TiN film on a substrate W in the processing chamber by CVD. The processing chamber has a gas exhaust system. The gas exhaust system includes a gas exhaust pipe for exhausting the exhaust gas in the processing chamber a trap mechanism provided to the gas exhaust pipe for trapping a by-product in the exhaust gas, and a heated reaction gas supply mechanism for supplying a heated reaction gas into the exhaust gas. The heated reaction gas is adapted to react with a component in the exhaust gas to produce a by-product. Specifically, $NH_3$ gas is supplied by the heated reaction gas supply mechanism as the heated reaction gas, and $NH_4Cl$ is produced as the by-product.

4 Claims, 5 Drawing Sheets

U.S. PATENT DOCUMENTS

2009/0191109 A1    7/2009  Tsuda

FOREIGN PATENT DOCUMENTS

| JP | 1 312833 | 12/1989 |
| JP | 02021616 A | 1/1990 |
| JP | 590162 | 4/1993 |
| JP | 07003464 A | 1/1995 |
| JP | 07066124 A | 3/1995 |
| JP | 2581955 B2 | 2/1997 |
| JP | 2000/0173925 | 6/2000 |
| JP | 2001/214272 | 8/2001 |
| JP | 2005/340283 | 12/2005 |

* cited by examiner

GAS EXHAUST SYSTEM OF FILM-FORMING APPARATUS, FILM-FORMING APPARATUS, AND METHOD FOR PROCESSING EXHAUST GAS

CROSS-REFERENCE(S) TO RELATED APPLICATIONS

This application is a continuation application of pending U.S. application Ser. No. 12/295,675, filed on Oct. 1, 2008, the entire contents of which is incorporated herein by reference, which is a national phase of PCT/JP2007/057398, filed on Apr. 2, 2007. This application also claims priority to Japanese Application No. 2006-102920 filed on Apr. 4, 2006 and Japanese Application No. 2007-066650, filed on Mar. 15, 2007.

FIELD OF THE INVENTION

The present invention relates to a gas exhaust system of a film-forming apparatus for forming a predetermined film by CVD, a film-forming apparatus having the gas exhaust system, and a method for processing an exhaust gas.

BACKGROUND OF THE INVENTION

In manufacturing semiconductor devices, various processes, such as film formation, quality modification, oxidation/diffusion, etching and the like, are performed on a semiconductor wafer as a substrate to be processed.

For the film formation, there is widely used a CVD (Chemical Vapor Deposition) method for forming a predetermined film through a chemical reaction by introducing a predetermined processing gas into a chamber accommodating a semiconductor wafer. In the CVD method, a film is formed by the reaction of the processing gas on the semiconductor wafer as a substrate to be processed. At this time, however, only 10% of the processing gas contributes to the reaction, and most of the processing gas remains unreacted.

The unreacted processing gas reacts with a reaction gas in the chamber or in a gas exhaust pipe into which the reaction gas is introduced, to produce a by-product. The by-product thus produced flows together with a by-product produced when forming a TiN film. When the by-products are cooled, a pipe is clogged or a vacuum pump is damaged. To that end, in general, a trap mechanism for trapping a by-product is provided at the gas exhaust pipe extending from the chamber.

Although it is preferable that the by-product is trapped by the trap mechanism in the form of a compound that is easily trapped and has a comparatively stable structure, the by-product produced at a flow rate ratio of each processing gas for film formation is not necessarily turned into a desired compound. Therefore, Japanese Patent Laid-open Publication No. 2001-214272 discloses a technique for producing a trappable by-product by introducing directly into a trap mechanism or into an upstream pipe a reaction gas that reacts with an impurity gas discharged from the chamber.

In theory, a desired stable by-product that is easily trapped can be produced by introducing a specific reaction gas. In practice, however, the reaction may proceed insufficiently, so that an unstable by-product or a by-product having an indefinite structure such as a complex or the like may be produced. Accordingly, the trap mechanism needs to be scaled up due to hard to trap the by-product and, also, the trap mechanism may be irregularly clogged due to an unreliable generation state (density or the like) of a reaction product.

SUMMARY OF THE INVENTION

In view of the above, the present invention provides a gas exhaust system of a film-forming apparatus which is capable of stably trapping a desired high-density by-product, a film-forming apparatus having the gas exhaust system, and a method for processing an exhaust gas.

In accordance with an aspect of the invention, there is provided a gas exhaust system of a film-forming apparatus for forming a film by CVD on a substrate placed in a processing chamber by supplying a processing gas into the processing chamber, the gas exhaust system of the film-forming apparatus including: a gas exhaust pipe connected to the processing chamber, for exhausting an exhaust gas in the processing chamber; a trap mechanism provided to the gas exhaust pipe, for trapping a by-product in the exhaust gas; and a heated reaction gas supply mechanism for supplying a heated reaction gas into the exhaust gas, the heated reaction gas adapted to react with a component in the exhaust gas to produce a by-product.

Preferably, a TiN film is formed by CVD on the substrate placed in the processing chamber by supplying $TiCl_4$ gas and $NH_3$ gas as the processing gas into the processing chamber and, at the same time, $NH_4Cl$ is produced as a by-product by supplying $NH_3$ gas as the heated reaction gas from the heated reaction gas supply mechanism.

Preferably, the $NH_3$ gas as the heated reaction gas is supplied while being heated at about 170° C. or higher.

Preferably, the heated reaction gas supply mechanism supplies the heated reaction gas to an upstream side of the trap mechanism on the gas exhaust pipe via a pipe.

Preferably, the heated reaction gas supply mechanism supplies the heated reaction gas to the trap mechanism via a pipe.

Preferably, the heated reaction gas supply mechanism includes a reaction gas heating unit for heating a reaction gas, and the reaction gas heating unit has a heating chamber for heating the reaction gas therein and a coiled heating element disposed in the heating chamber.

Preferably, a bypass pipe for exhausting the processing gas without passing through the processing chamber is connected to an inlet side of the processing chamber.

Preferably, the gas exhaust system further includes a heating/mixing chamber for heating and mixing the processing gas flowing through the bypass pipe and the heated reaction gas supplied from the heated reaction gas supply mechanism.

In accordance with another aspect of the invention, there is provided a film-forming apparatus for forming a film on a substrate, including: a processing chamber in which a substrate is placed; a processing gas supply mechanism for supplying a processing gas into the processing chamber where the substrate is placed; a unit for causing a film forming reaction on the substrate by imparting energy to the processing gas; and a gas exhaust system for exhausting an exhaust gas in the processing chamber and processing the exhaust gas, wherein the gas exhaust system includes: a gas exhaust pipe for exhausting the exhaust gas in the processing chamber; a trap mechanism provided to the exhaust pipe, for trapping a by-product in the exhaust gas; and a heated reaction gas supply mechanism for supplying a heated reaction gas into the exhaust gas, the heated reaction gas adapted to react with a component in the exhaust gas to produce a by-product.

Preferably, the processing gas supply mechanism is provided with a unit for heating the substrate placed in the processing chamber to form a TiN film by causing a film forming reaction on the substrate by supplying $TiCl_4$ gas and $NH_3$ gas as the processing gas into the processing chamber, and $NH_4Cl$ is produced as a by-product by supplying $NH_3$ gas as the heated reaction gas from the heated reaction gas supply mechanism.

In accordance with still another aspect of the invention, there is provided a method for processing an exhaust gas in a film-forming apparatus for forming a film by CVD on a substrate placed in a processing chamber by supplying a processing gas into the processing chamber, the method including: exhausting the exhaust gas in the processing chamber through a gas exhaust pipe connected to the processing chamber; forming a by-product by supplying a heated reaction gas into the exhaust gas flowing in the gas exhaust pipe, the heated reaction gas adapted to react with a component in the exhaust gas; and trapping the by-product by a trap mechanism.

Preferably, a TiN film is formed by CVD on a substrate placed in the processing chamber by supplying $TiCl_4$ gas and $NH_3$ gas as the processing gas into the processing chamber and, at the same time, $NH_4Cl$ is produced as the by-product by supplying $NH_3$ gas as the heated reaction gas, which reacts with $TiCl_4$ in the exhaust gas, into the exhaust gas flowing in the gas exhaust pipe and, then, the produced $NH_4Cl$ as the by-product is trapped by the trap mechanism.

In accordance with still another aspect of the invention, there is provided a computer-readable storage medium storing software for executing a control program in a computer, wherein, when executed, the control program controls a method for processing an exhaust gas in a film-forming apparatus for forming a film by CVD on a substrate placed in a processing chamber by supplying a processing gas into the processing chamber, the method including: exhausting an exhaust gas in the processing chamber through a gas exhaust pipe connected to the processing chamber; forming a by-product by supplying a heated reaction gas into the exhaust gas flowing in the gas exhaust pipe, the heated reaction gas adapted to react with a component in the exhaust gas; and trapping the by-product by a trap mechanism.

In accordance with still another aspect of the invention, there is provided a computer program for, when executed on a computer, controlling a film-forming apparatus to perform a method for processing an exhaust gas in the film-forming apparatus for forming a film by CVD on a substrate placed in a processing chamber by supplying a processing gas into the processing chamber, the method including: exhausting an exhaust gas in the processing chamber through a gas exhaust pipe connected to the processing chamber; forming a by-product by supplying a heated reaction gas into the exhaust gas flowing in the gas exhaust pipe, the heated reaction gas adapted to react with a component in the exhaust gas; and trapping the by-product by a trap mechanism.

In accordance with the present invention, by supplying the heated reaction gas adapted to react with a component in the exhaust gas to produce a by-product, the reaction for producing a by-product can proceed sufficiently with an increased productivity, so that a stable by-product can be produced to be trapped by the trap mechanism. Accordingly, it is possible to suppress the production of a by-product having a highly indefinite element, so that the trap efficiency can be increased.

Particularly, in case $TiCl_4$ gas and $NH_3$ gas are used as the processing gas and $NH_3$ gas is supplied to the gas exhaust pipe by the heated reaction gas supply mechanism, a high-density stable $NH_4Cl$ can be produced as the by-product. This by-product can be easily trapped and the irregular clogging of the trap mechanism can be reduced. As a consequence, the by-product can be trapped efficiently without scaling up the trap mechanism.

DETAILED DESCRIPTION OF THE EMBODIMENT

Embodiments of the present invention will be described with reference to the accompanying drawings which form a part hereof. In the present embodiment, there will be described, as an example, a case where a TiN film is formed by CVD on a surface of a semiconductor wafer (hereinafter, referred to as "wafer") as a substrate to be processed.

Figure 1:
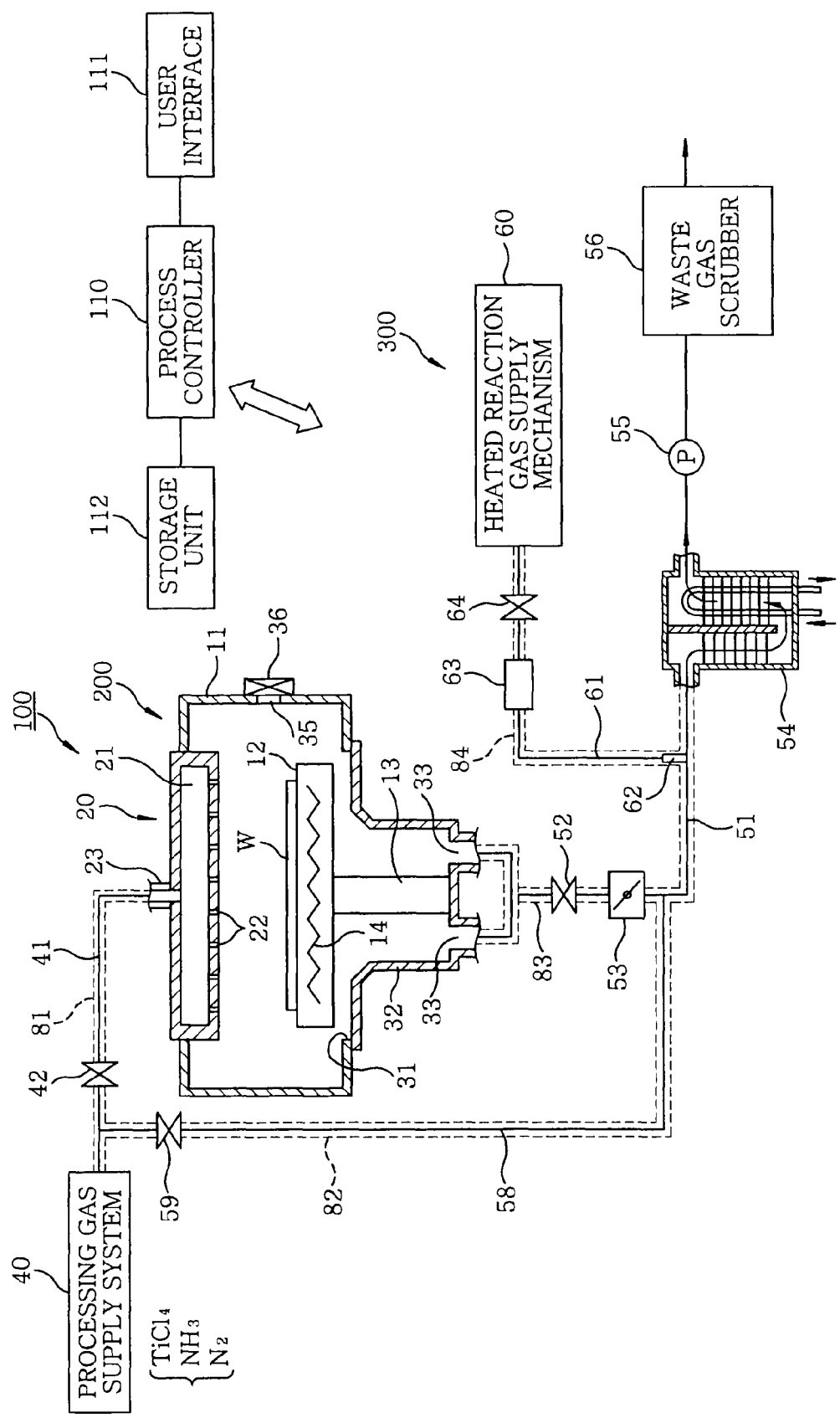
FIG. 1 is a schematic view of a film-forming apparatus having a gas exhaust system in accordance with an embodiment of the present invention.

FIG. 1 is a schematic view of a film-forming apparatus having a gas exhaust system in accordance with an embodiment of the present invention.

A film-forming apparatus 100 includes a film-forming processing unit 200 and a gas exhaust system 300.

The film-forming processing unit 200 has a substantially cylindrical chamber (processing chamber) 11 made of aluminum or aluminum alloy (e.g., JIS A5052). In the chamber 11, a susceptor 12 for horizontally supporting a wafer W as a substrate to be processed is supported by a cylindrical supporting member 13 provided at a central bottom portion thereof. A heater 14 is buried in the susceptor 12 to heat the wafer W to a predetermined temperature.

A shower head 20 serving as a gas injection member is provided at an upper portion of the chamber 11. The shower head 20 is formed in a disk shape and has a gas diffusion space 21 therein and a plurality of gas injection openings 22 formed at a bottom portion thereof. Moreover, a gas supply port 23 is provided at an upper central portion of the shower head 20.

A circular opening 31 is formed at a central portion of a bottom wall of the chamber 11, and a gas exhaust chamber 32 projects downward to cover the opening 31. A gas exhaust port 33 is formed in a bottom surface of the gas exhaust chamber 32. Besides, a loading/unloading port 35 for loading/unloading the wafer W is formed in a sidewall of the chamber 11. The loading/unloading port 35 is openable/closable by a gate valve 36.

A processing gas supply system 40 for supplying a processing gas for film formation is connected to the shower head 20 via a pipe 41, and an opening/closing valve 42 is provided in the middle of the pipe 41. The processing gas supply system 40 has a plurality of gas supply sources for supplying $TiCl_4$ gas, $NH_3$ gas, $N_2$ gas and the like, and the gases can be supplied into the chamber 11 via the pipe 41 and the shower head 20 at respective flow rates controlled by a flow rate controller such as a mass flow controller. Further, although the pipe 41 is illustrated as a single pipe for convenience, the gases may be supplied through separate pipes.

Meanwhile, the gas exhaust system 300 has a gas exhaust pipe 51 connected to the gas exhaust port 33. As for the gas exhaust pipe 51, there is used one that is made of stainless steel and has an inner diameter of about 5 to 10 cm. On the gas exhaust pipe 51, there are provided an opening/closing valve 52, a pressure control valve 53, a trap mechanism 54 for trapping a reaction by-product in an exhaust gas, a vacuum pump 55 for evacuating the chamber 11 and a waste gas scrubber 56 for completely removing impurity remaining in the exhaust gas, all being disposed in that order from the upstream side. Further, as shown in FIG. 1, the pressure control valve 53 may be provided between the trap mechanism 54 and the vacuum pump 55 to reduce the reaction by-product adhered to the pressure control valve 53, so that the maintenance cycle of the pressure control valve 53 can be lengthened.

A bypass pipe 58 is connected between an upstream portion of the opening/closing valve 42 in the pipe 41 and a downstream portion of the pressure control valve 53 in the gas exhaust pipe 51. The bypass pipe 58 is provided with an opening/closing valve 59. The bypass pipe 58 is used for directly exhausting a processing gas supplied to stabilize a gas flow rate to the gas exhaust pipe 51 without passing through the chamber 11.

The upstream side of the trap mechanism 54 in the gas exhaust pipe 51 is connected to a pipe 61 extending from a heated reaction gas supply mechanism 60 via a nozzle 62. The heated reaction gas supply pipe 61 is provided with a flow rate controller 63 such as a mass flow controller and an opening/closing valve 64. Further, when the heated reaction gas is supplied from the heated reaction gas supply mechanism 60 to the by-product or the unreacted processing gas flowing in the gas exhaust pipe 51 via the heated reaction gas supply pipe 61 and the nozzle 62, it is possible to produce a stable high-density by-product that is easily trapped. In the present embodiment, a heated $NH_3$ gas is typically supplied as the heated reaction gas.

Figure 2:
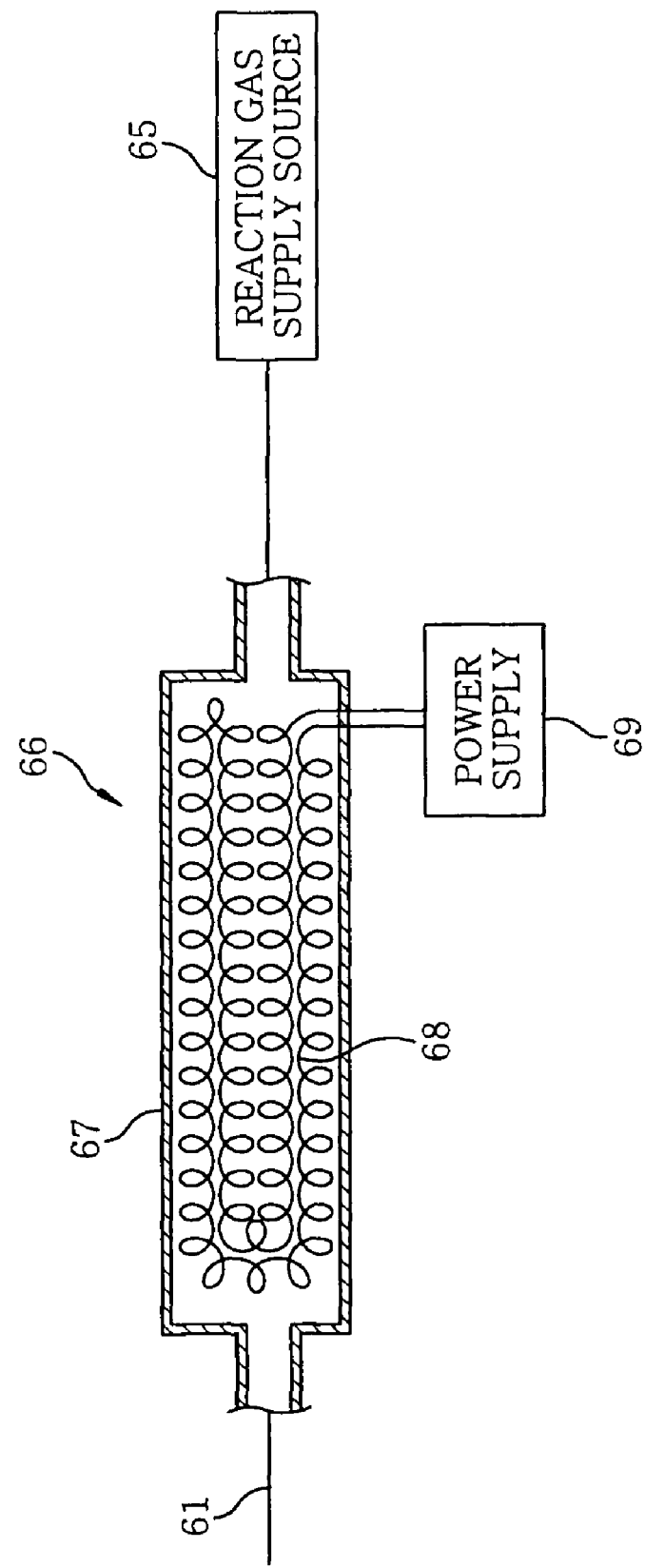
FIG. 2 shows a schematic view of a heated reaction gas supply mechanism used in the gas exhaust system of the film-forming apparatus shown in FIG. 1.

As illustrated in FIG. 2, the heated reaction gas supply mechanism 60 includes a reaction gas supply source 65 and a reaction gas heating unit 66. The reaction gas heating unit 66 has a gas heating vessel 67 for heating a reaction gas and a heating element 68 disposed therein. The heating element 68 is coiled in a specific shape to have a considerably large heating area. The heating element 68 instantly heats the reaction gas supplied to the gas heating vessel 67. A power supply 69 is connected to the heating element 68, so that the reaction gas is heated to a desired temperature by controlling the output of the power supply 69. At this time, the temperature of the heated reaction gas is preferably higher than or equal to about 170° C. in view of ensuring the desired reaction. Further, it is preferably lower than or equal to about 400° C. in view of ensuring safety of equipments, and more preferably about 200 to 350° C. Further, when the processing gas supply system 40 includes the reaction gas, it is possible to omit the reaction gas supply source 65, and the reaction gas can be supplied from the processing gas supply system 40.

Figure 3:
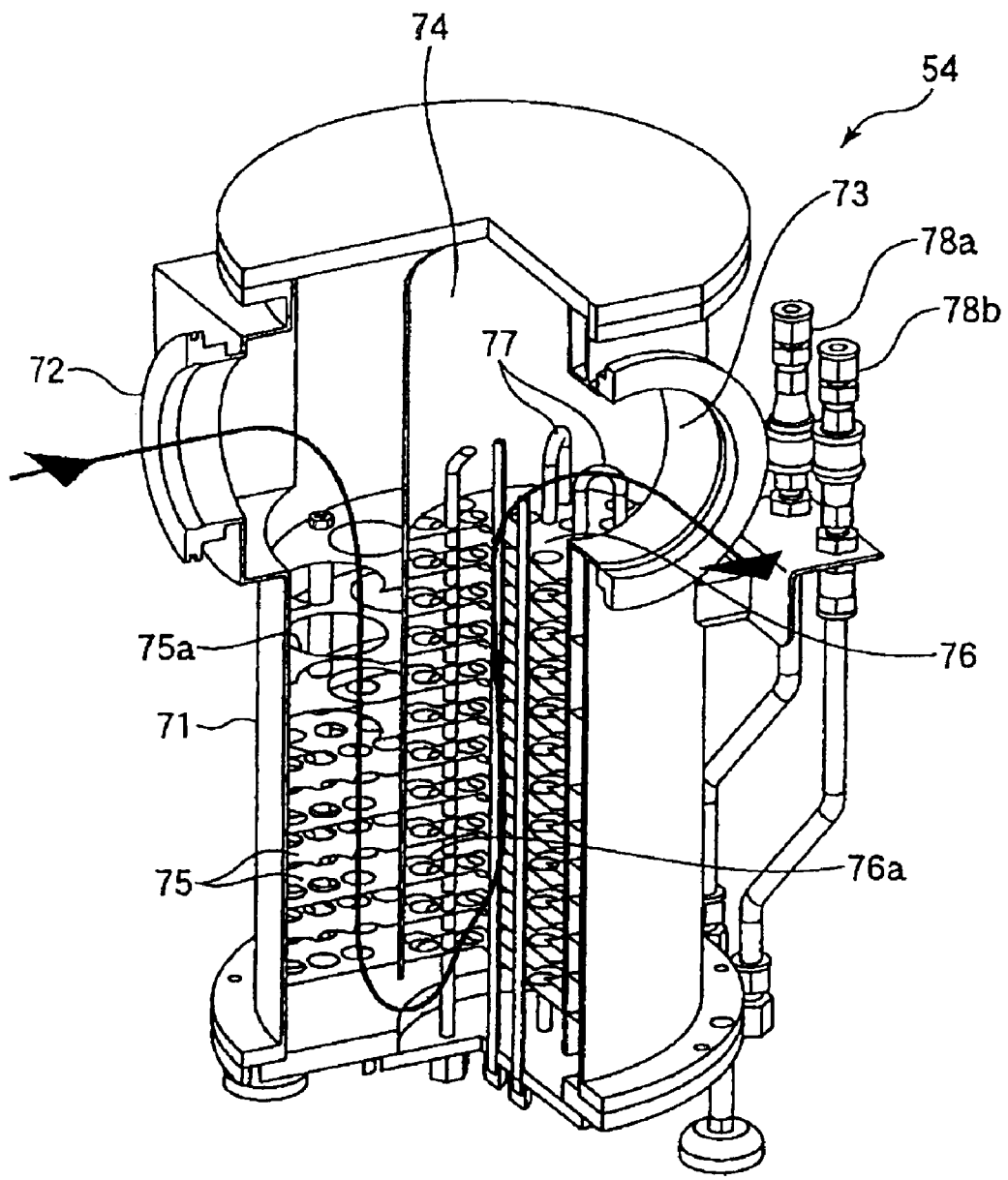
FIG. 3 provides a partially cutaway perspective view of a trap mechanism used in the gas exhaust system of the film-forming apparatus shown in FIG. 1.

As depicted in the enlarged view of FIG. 3, the trap mechanism 54 has a cylindrical housing 71. Formed at an upper portion of a sidewall of the housing 71 are an exhaust gas inlet 72 and an exhaust gas outlet 73. A cylindrical cooling chamber 74 is formed on the side of the exhaust gas outlet 73 of the housing 71 so as to be eccentric with respect to the housing 71. In the housing 71, the cooling chamber 74 and the outside thereof communicate with each other at the bottom portion of the housing 71. In the outside of the cooling chamber 74 in the housing 71, a plurality of horizontal trap plates 75 having a plurality of gas through holes 75a are vertically arranged.

Meanwhile, also in the inside of the cooling chamber 74, a plurality of horizontal trap plates 76 having a plurality of gas through holes 76a are vertically arranged. In the cooling chamber 74, a cooling water pipe 77 is provided to penetrate the trap plates 76, and the trap plates 76 are cooled by circulating cooling water in the cooling water pipe 77. Further, a cooling water supply pipe 78a and a cooling water discharge pipe 78b which are connected to the cooling water pipe 77 are provided outside the housing 71.

In the trap mechanism 54, the exhaust gas introduced through the exhaust gas inlet 72 into the housing 71 flows downward through the gas through holes 75a of the trap plates 75 and then reaches the cooling chamber 74 at the bottom portion of the housing 71. In the cooling chamber 74, the exhaust gas flows upward through the gas through holes 76a of the cooled trap plates 76 and is then discharged through the exhaust gas outlet 73. At this time, the by-product is trapped by the trap plates 75 and 76. The trap plates 76 are cooled by the cooling water, so that the trap efficiency can be increased.

The pipe 41, the bypass pipe 58 and the gas exhaust pipe 51 are respectively wound by tape heaters 81, 82 and 83, as indicated by dashed lines in the drawings. By heating them to a predetermined temperature, gaseous components are prevented from being condensed inside the pipes. Further, the heated reaction gas supply pipe 61 is wound by a tape heater 84, so that it is possible to avoid the decreases of the temperature of the heated reaction gas supplied from the heated reaction gas supply mechanism 60.

Each part of the film-forming apparatus 100 is connected to and controlled by a process controller 110 including a micro processor (computer). Further, a user interface 111 is connected to the process controller 110. The user interface 111 includes, e.g., a keyboard for a process manager to input a command to operate the film-forming apparatus 100, a display for showing an operational status of the process controller 110 and the like. Moreover, connected to the process controller 110 is a storage unit 112 for storing therein, e.g., control programs to be used in realizing various processes, which are performed in the film-forming apparatus 100 under the control of the process controller 110 and programs, i.e., recipes to be used in operating each part of the film-forming apparatus 100 to carry out processes in accordance with processing conditions. The recipes can be stored in a hard disk or a semiconductor memory, or can be set at a certain position of the storage unit 112 while being recorded on a portable storage medium such as a CDROM, a DVD and the like. Further, the recipes can be transmitted from another device via, e.g., a dedicated line. If necessary, the process controller 110 executes a recipe read from the storage unit 112 in response to instructions from the user interface 111, thereby implementing a required process in the film-forming apparatus 100 under the control of the process controller 50.

Hereinafter, a processing operation of the film-forming apparatus configured as described above will be described.

First of all, the chamber 11 is evacuated to vacuum by operating the gas exhaust system 300. Next, the wafer W is loaded into the chamber 11 and mounted on the susceptor 12. Thereafter, the wafer W is heated to a predetermined temperature by the heater 14. In that state, $TiCl_4$ gas, $NH_3$ gas and $N_2$ gas are made to flow at respective flow rates from the processing gas supply system 40 to the bypass pipe 58, thereby performing a pre-flow process. After the flow rates of the gases become stable, the gases are supplied into the chamber 11 via the shower head 20 through the pipe 41 and, at the same time, the pressure control valve 53 is driven to maintain the inside of the chamber 11 at a predetermined pressure. In that state, the TiCl$_4$ gas and the NH$_3$ gas react on the wafer W maintained at a predetermined temperature on the susceptor 12, thereby depositing a TiN film on the surface of the wafer W.

When the TiN film is formed by supplying the TiCl$_4$ gas, the NH$_3$ gas and the N$_2$ gas, the exhaust gas is exhausted via the gas exhaust pipe 51. In that case, the processing gas consumed by the reaction is only about 10%, and most of the processing gas remains unreacted. The unreacted processing gas reacts with a reaction gas in the chamber 11 or in the gas exhaust pipe into which the reaction gas is introduced to produce a by-product. The by-product thus produced flows in the gas exhaust pipe 51 together with a by-product produced when forming the TiN film.

At this time, if NH$_4$Cl is mainly produced as the by-product by causing the reaction of the following Eq. (1) in the chamber 11 and the gas exhaust pipe 51, it can be easily trapped by the trap mechanism 54 in the form of a stable high-density by-product. In other words, in the present embodiment, NH$_4$Cl is a by-product to be trapped by the trap mechanism 54.

$$6\text{TiCl}_4 + 32\text{NH}_3 \rightarrow 6\text{TiN} + 24\text{NH}_4\text{Cl} + \text{N}_2 \qquad \text{Eq. (1)}$$

Meanwhile, when the TiN film is formed, the TiCl$_4$ gas and the NH$_3$ gas of the processing gas are introduced into the chamber 11 at substantially the same flow rates, so that the NH$_3$ gas is insufficient for causing the reaction of Eq. (1) to occur. Therefore, in the present embodiment, the NH$_3$ gas is supplimentarily supplied from the heated reaction gas supply mechanism 60 to the pipe 51 in order to cause the reaction of Eq. (1) to take place. At this time, according to Eq. (1), the flow rate of the NH$_3$ gas supplimentarily supplied is preferably four times greater than that of the NH$_3$ gas for film formation.

In that case, if the NH$_3$ gas is introduced at a room temperature, even through the trap efficiency of the trap mechanism 54 increases, the reaction of Eq. (1) proceeds insufficiently, producing a complex (TiCl$_4$·4NH$_3$) as an indefinite element obtained by the following Eq. (2). TiCl$_4$·4NH$_3$ is difficult to be trapped by the trap mechanism 54, so that the trap mechanism 54 needs to be scaled up. Moreover, TiCl$_4$·4NH$_3$ has a low density and a high volume. Therefore, if the amount of TiCl$_4$·4NH$_3$ increases, the trap mechanism 54 may be clogged at an initial stage. Besides, the generation amount of TiCl$_4$·4NH$_3$ is not determined, so that the trap mechanism is clogged irregularly.

$$\text{TiCl}_4 + 4\text{NH}_3 \rightarrow \text{TiCl}_4 \cdot 4\text{NH}_3 \qquad \text{Eq. (2)}$$

According to the research on the cause of the above problems, it has been found that when the NH$_3$ gas is introduced as it is into the gas exhaust pipe 51, the heat energy for the reaction of Eq. (1) is insufficient. Also, it has been found that the NH$_3$ gas needs to be heated and supplied to the gas exhaust pipe 51 in order to make the reaction of Eq. (1) predominant while suppressing the reaction of Eq. (2).

In the present embodiment, by introducing the heated NH$_3$ gas from the heated reaction gas supply mechanism 60 to the gas exhaust pipe 51, the by-product mainly formed of NH$_4$Cl is produced by the reaction of eq. (1) while suppressing the reaction of eq. (2) and is trapped by the trap mechanism 54. At this time, the temperature of the heated NH$_3$ gas is preferably higher than or equal to about 170° C. in view of ensuring the reaction of Eq. (1). Further, it is preferably lower than or equal to about 400° C. in view of ensuring safety of equipments. When the by-product is trapped by the trap plates 75 and 76 in the trap mechanism 54, NH$_4$Cl is cooled by the trap plates 76 cooled in the cooling chamber 74, so that the higher trap efficiency can be maintained.

Here, TiCl$_4$·4NH$_3$ is a complex in which four NH$_3$ molecules are coordinate-covalent-bonded with a TiCl$_4$ molecule, and NH$_4$Cl is an ionically bonded salt having a large chemical bonding force. Therefore, if the by-product mainly formed of NH$_4$Cl is produced by suppressing the generation of TiCl$_4$·4NH$_3$ as an indefinite element, it is possible to obtain a high-density stable by-product that is easily trapped. Besides, the irregular clogging of the trap mechanism 54 can be reduced. As a consequence, the by-product can be trapped reliably and efficiently without scaling up the trap mechanism 54 and, hence, the maintenance cycle of the trap mechanism can be greatly lengthened. Furthermore, in case the average maintenance cycle is made to be equal to that of a conventional trap mechanism, the trap mechanism 54 can become compact in size.

In addition, according to a result of a test performed by using the conventional trap mechanism as the trap mechanism 54, it has been found that the volume of the by-product can be reduced to about ⅓ and also that the maintenance cycle of the trap mechanism 54 can be lengthened by three times.

The exhaust gas remaining after the by-product is trapped by the trap mechanism 54 is led to the waste gas scrubber 56 via the vacuum pump 55, and impurity components are completely removed therein. As the reaction proceeds according to Eq. (1), TiN as well as NH$_4$Cl can be trapped by the trap mechanism 54. Further, since N$_2$ is a harmless gas component, the amount of harmful impurity components that are not trapped by the trap mechanism 54 can be minimized and, hence, the burden on the waste gas scrubber 56 can be reduced. As a result, the running cost of the waste gas scrubber 56 can be reduced, and the lifespan thereof can be extended.

Since the heated NH$_3$ gas supplied from the heated reaction gas supply mechanism 60 is supplied via the pipe 61, the temperature thereof may decrease when it reaches the gas exhaust pipe 51. However, the NH$_3$ gas can be supplied at a desired temperature by heating the pipe 61 with the tape heater 84 to suppress the temperature decrease thereof.

Figure 4:
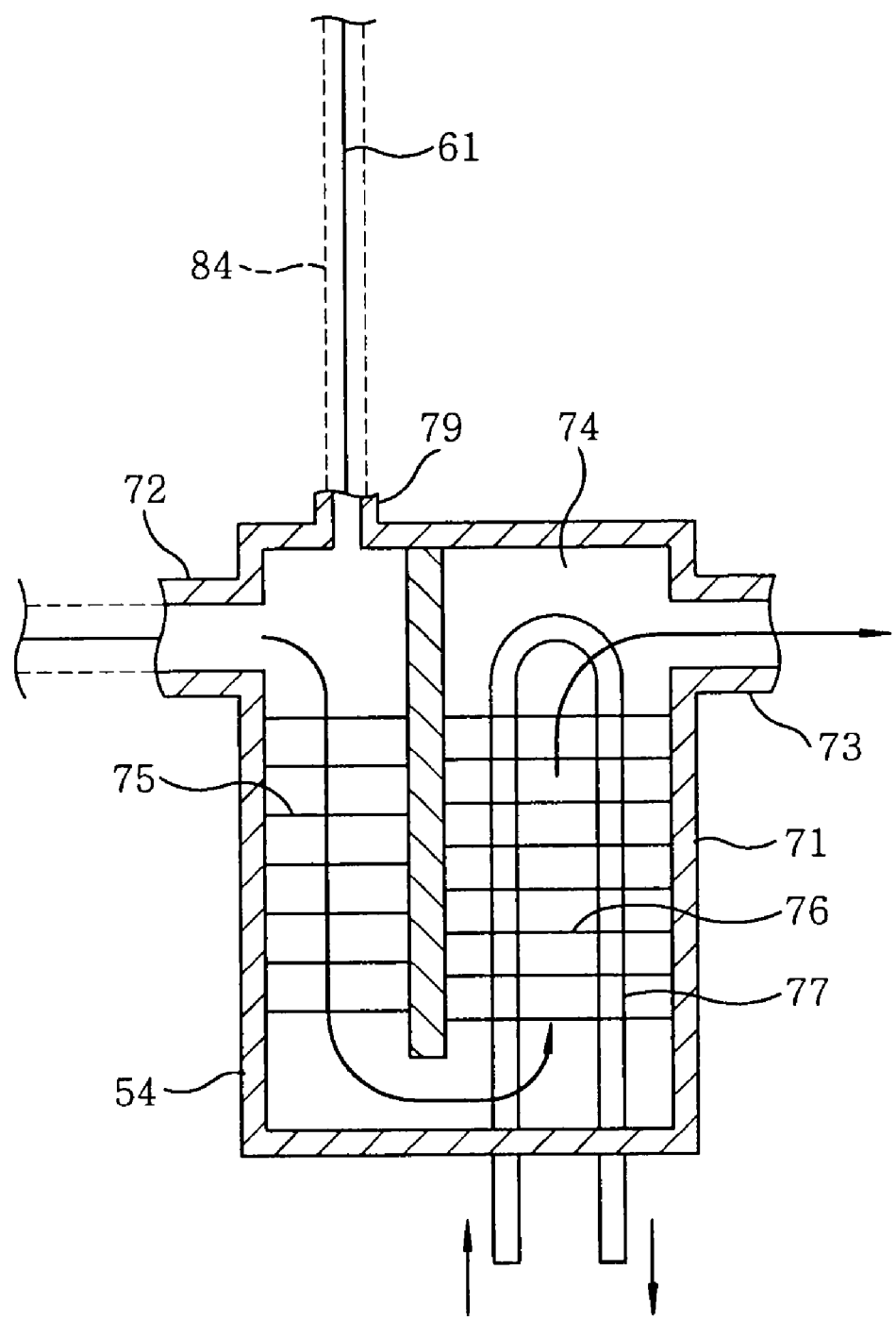
FIG. 4 describes a schematic view of another example of a connection of a heated reaction gas supply mechanism in the gas exhaust system of the film-forming apparatus shown in FIG. 1.

In the present embodiment, the heated NH$_3$ gas is introduced into the gas exhaust pipe 51 and, thus, the reactivity increases. As a consequence, when the heated NH$_3$ gas is supplied to the gas exhaust pipe 51, it is only required to connect the nozzle 62 to the gas exhaust pipe 51. Moreover, due to the high reactivity, the heated NH$_3$ gas may be directly introduced into the trap mechanism 54 by providing a gas inlet port 79 at the trap mechanism 54 and connecting the pipe 61 thereto, as illustrated in FIG. 4.

Figure 5:
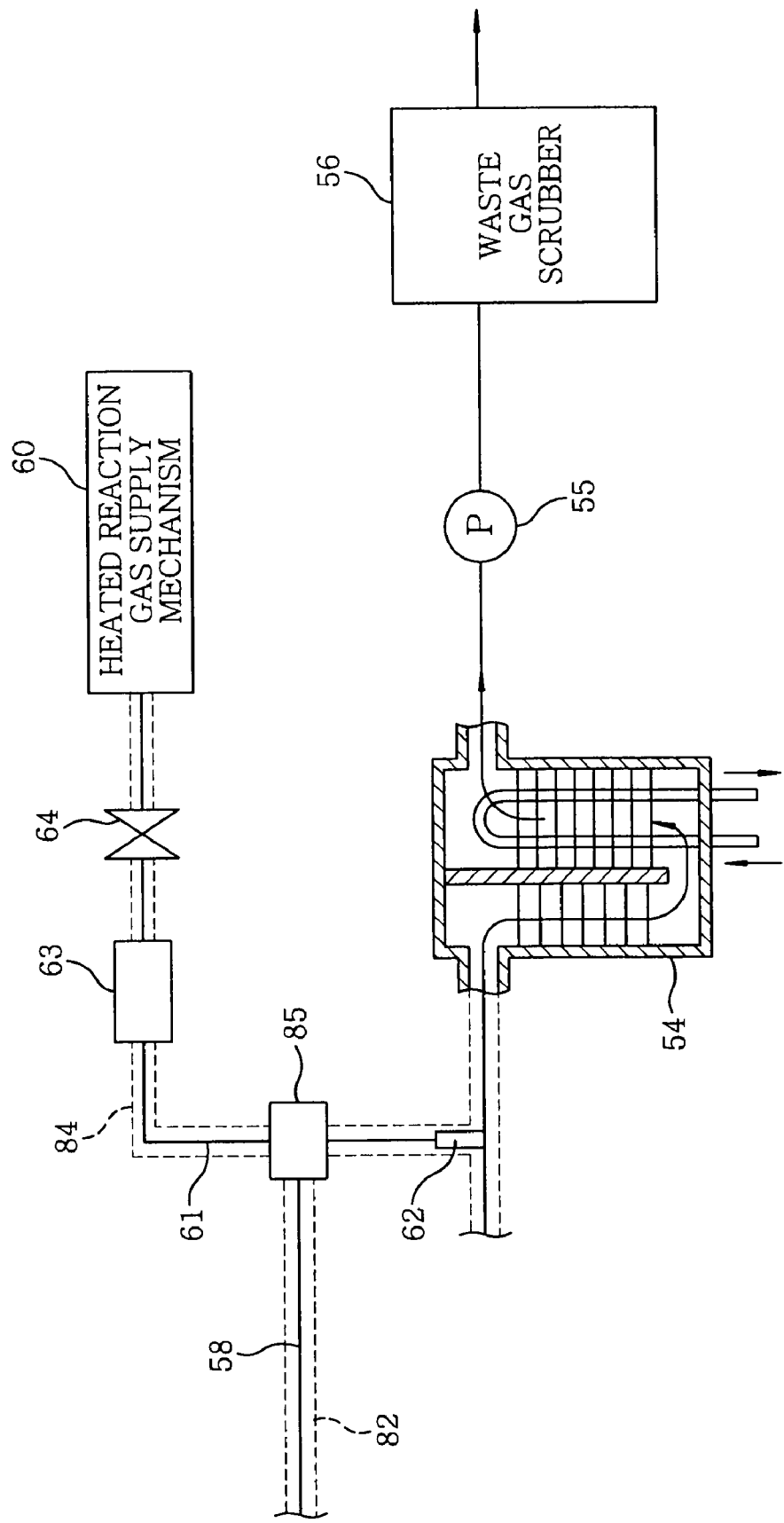
FIG. 5 offers a schematic view of an example in which a processing gas flowing in a bypass pipe and a heated reaction gas are mixed in a heating/mixing chamber in the exhaust structure of the film-forming apparatus shown in FIG. 1.

Moreover, instead of directly connecting the bypass pipe 58 to the gas exhaust pipe 51, it is possible to provide a heating/mixing chamber 85 in the middle of the pipe 61 and connect the bypass pipe 58 thereto, as can be seen from FIG. 5. Accordingly, the processing gas flowing from the bypass pipe 58 can be made to flow into the gas exhaust pipe 51, after being heated and mixed with the heated NH$_3$ gas. As a result, the trap efficiency of the processing gas flowing through the bypass pipe 58 can be further increased.

The present invention can be variously modified without being limited to the above embodiments. For example, in the above embodiments, there has been described an example in which a TiN film is formed by using TiCl$_4$ gas and NH$_3$ gas. However, the present invention can be applied to various film forming processes to be described below, without being limited to the above example.

(1) When the present invention is applied to the case of forming a Ti film by using $TiCl_4$ gas and $H_2$ gas, HCl is a by-product to be trapped. By supplying a heated $H_2$ gas as a heated reaction gas into the exhaust gas, HCl can be trapped stably.

(2) When the present invention is applied to the case of forming a W film by using $WF_6$ gas and $SiH_4$ gas, $SiF_4$ and HF are by-products to be trapped. By supplying a heated $SiH_4$ gas as a heated reaction gas into the exhaust gas, $SiF_4$ and HF can be trapped stably.

(3) When the present invention is applied to the case of forming a W film by using $WF_6$ gas and $SiH_2Cl_2$ gas, $SiF_4$, HF, HCl and $Cl_2$ are by-products to be trapped. By supplying a heated $SiH_2Cl_2$ gas as a heated reaction gas into the exhaust gas, $SiF_4$, HF, HCl and $Cl_2$ can be trapped stably.

(4) When the present invention is applied to the case of forming a $Ta_2O_5$ film as a high-k dielectric film by using $Ta(OC_2H_5)$ gas, a high-density solid having an indefinite composition can be stably trapped by supplying heated steam or heated $O_2$ gas as a heated reaction gas into the exhaust gas.

Further, in the above embodiments, there has been described an example in which $NH_3$ gas as a reaction gas is heated while passing through the heating element 68 that is coiled in a specific shape in the gas heating chamber 67 to have a considerably large heating area. However, the conventionally known gas heating unit can be widely used without being limited to the above example.

In addition, the structure of the trap mechanism 54 is not particularly limited, and a trap mechanism having a conventional structure can be employed.

Furthermore, in the above embodiment, a semiconductor wafer is used as an example of a substrate to be processed. However, it is not limited thereto, and there may be used another substrate such as a glass substrate for a flat panel display (FPD) represented by a liquid crystal display (LCD).

What is claimed is:

1. A method for processing an exhaust gas in a film-forming apparatus for forming a film by CVD on a substrate placed in a processing chamber by supplying a processing gas into the processing chamber, the method comprising:

exhausting the exhaust gas from the processing chamber through a gas exhaust pipe connected to the processing chamber;

supplying a heated reaction gas into the exhaust gas pipe at a position downstream from the processing chamber and at a preheated temperature to react with $TiCl_4$ in the exhaust gas and thereby produce ammonium chloride ($NH_4Cl$) and suppress the production of an ammonium titanium chloride ($TiCl_4 \cdot 4NH_3$); and trapping the ammonium chloride as a by-product by a trap mechanism provided to the gas exhaust pipe, wherein a TiN film is formed by CVD on a substrate placed in the processing chamber by supplying $TiCl_4$ gas and $NH_3$ gas as the processing gas into the processing chamber, and wherein the ammonium chloride is produced by supplying $NH_3$ gas as the heated reaction gas, which reacts with $TiCl_4$ in the exhaust gas, into the exhaust gas and the production of the ammonium titanium chloride is suppressed in the exhaust gas.

2. The method of claim 1, wherein the $NH_3$ gas as the heated reaction gas is supplied while being heated at about 170° C. or higher.

3. The method of claim 1, wherein the heated reaction gas is supplied to the gas exhaust pipe at an upstream side of the trap mechanism via a pipe.

4. The method of claim 1, wherein the heated reaction gas is provided to the trap mechanism via a pipe.

* * * * *